US012607656B2

(12) United States Patent
Mosalikanti et al.

(10) Patent No.: US 12,607,656 B2
(45) Date of Patent: Apr. 21, 2026

(54) VOLTAGE DROOP DETECTION AND FREQUENCY RECOVERY

(71) Applicant: Intel Corporation, Santa Clara, CA (US)

(72) Inventors: Praveen Mosalikanti, Portland, OR (US); Vaughn J. Grossnickle, Hillsboro, OR (US); Nasser A. Kurd, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 875 days.

(21) Appl. No.: 17/708,964

(22) Filed: Mar. 30, 2022

(65) Prior Publication Data

US 2023/0314488 A1 Oct. 5, 2023

(51) Int. Cl.
H03K 5/00 (2006.01)
G01R 19/165 (2006.01)
H03K 5/24 (2006.01)

(52) U.S. Cl.
CPC ... G01R 19/16538 (2013.01); H03K 5/00006 (2013.01); H03K 5/24 (2013.01)

(58) Field of Classification Search
None
See application file for complete search history.

(56) References Cited

U.S. PATENT DOCUMENTS

| | | | | |
|---|---|---|---|---|
| 10,855,222 | B2 * | 12/2020 | Robinson | H03B 5/04 |
| 11,048,284 | B2 * | 6/2021 | Mosalikanti | H03L 7/093 |
| 2015/0002197 | A1 * | 1/2015 | Chatterjee | H03L 7/095 |
| | | | | 327/155 |
| 2022/0011800 | A1 * | 1/2022 | Nasir | H02M 3/157 |

FOREIGN PATENT DOCUMENTS

CN 116896376 10/2023

* cited by examiner

*Primary Examiner* — Cassandra F Cox
(74) *Attorney, Agent, or Firm* — Schwegman Lundberg & Woessner, P.A.

(57) ABSTRACT

A single droop detector and an asynchronous frequency recovery circuit may be used to slow down a frequency asynchronously when a voltage droop is detected and exit the droop event synchronously by gradually changing an electronic oscillator buffer capacitance until the frequency has been fully restored. This combination of a single droop detector and an asynchronous frequency recovery circuit may provide reduced detection and response latency. This solution may also provide improved performance in the presence of multiple voltage droop events that occur before a frequency has been fully restored from the previous droop. This solution also reduces or eliminates frequency over-shoots and secondary voltage droops.

20 Claims, 10 Drawing Sheets

100

VCC
105

HPF
110

VHPF
115

COMP0
120

VCCPLL

−

+

DD_OUT0
140

VTH0
130

COMP1
125

VCCPLL

−

+

DD_OUT1
145

VTH1
135

300

VCCDIST
305

COMPARATOR
310

VCC PLL

DD_OUT0
315

ASYNCHRONOUS
CAPACITANCE
GENERATOR
320

VCCPLL

ΔF
325

CB
330

OSCILLATOR
340

900

910    DETECT VOLTAGE DROOP ONSET

920    GENERATE VOLTAGE DROOP INDICATION SIGNAL

930    GENERATE DROOP CAPACITANCE VALUE

940    GENERATE DROOP OSCILLATION VALUE

950    DETECT VOLTAGE DROOP RECOVERY EVENT

960    GENERATE VOLTAGE DROOP RECOVERY OUTPUT

970    GENERATE PLURALITY OF SEQUENTIAL
FREQUENCY SLOWDOWN CAPACITANCE VALUES

980    GENERATE PLURALITY OF OUTPUT OSCILLATION VALUES

VOLTAGE DROOP DETECTION AND FREQUENCY RECOVERY

TECHNICAL FIELD

Embodiments described herein generally relate to power driver circuits.

BACKGROUND

Power driver circuits (e.g., power amplifiers, voltage regulators) may be used to provide power to other circuits or electronic devices. A supply voltage provided by a power driver circuit may exhibit a voltage droop when the load increases. In response to a voltage droop, a frequency may be reduced to reduce errors caused by circuit components operating at a reduced voltage. However, as the power driver circuit recovers from the voltage droop, the supply voltage and frequency recovery may overshoot a target voltage level.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

The circuits and methods described herein provide technical solutions for technical problems facing electronic components or computing devices. In response to a voltage droop, a single droop detector and an asynchronous frequency recovery circuit may be used to slow down a frequency asynchronously when a droop is detected and exit the droop event synchronously by gradually changing an electronic oscillator buffer capacitance until the frequency has been fully restored. This combination of a single droop detector and an asynchronous frequency recovery circuit may provide reduced detection and response latency. This solution may also provide improved performance in the presence of multiple voltage droop events that occur before a frequency has been fully restored from the previous droop. This solution also reduces or eliminates frequency overshoots and ringing during frequency recovery.

In the following description, for purposes of explanation, numerous specific details are set forth to provide a thorough understanding of some example embodiments. It will be evident, however, to one skilled in the art that the present disclosure may be practiced without these specific details.

Figure 1:
FIG. 1 is a circuit diagram illustrating a first adaptive frequency synthesis (AFS) circuit, according to an embodiment.

FIG. 1 is a circuit diagram illustrating a first adaptive frequency synthesis (AFS) circuit 100, according to an embodiment. The AFS circuit 100 includes a high-pass filter (HPF) 110 that receives a common collector voltage VCC 105 and generates a high-pass filter voltage (VHPF) 115. The VHPF 115 is provided to a first droop detector (DD) comparator 120 and to a second DD comparator 125. The first comparator 120 uses the high-pass filter voltage 115 and a first threshold voltage 130 to generate a first DD comparator output 140. Similarly, the second DD comparator 125 uses the VHPF 115 and a second threshold voltage 135 to generate a second DD comparator output 145. An example timing diagram generated by AFS circuit 100 is shown in FIG. 2.

Figure 2:
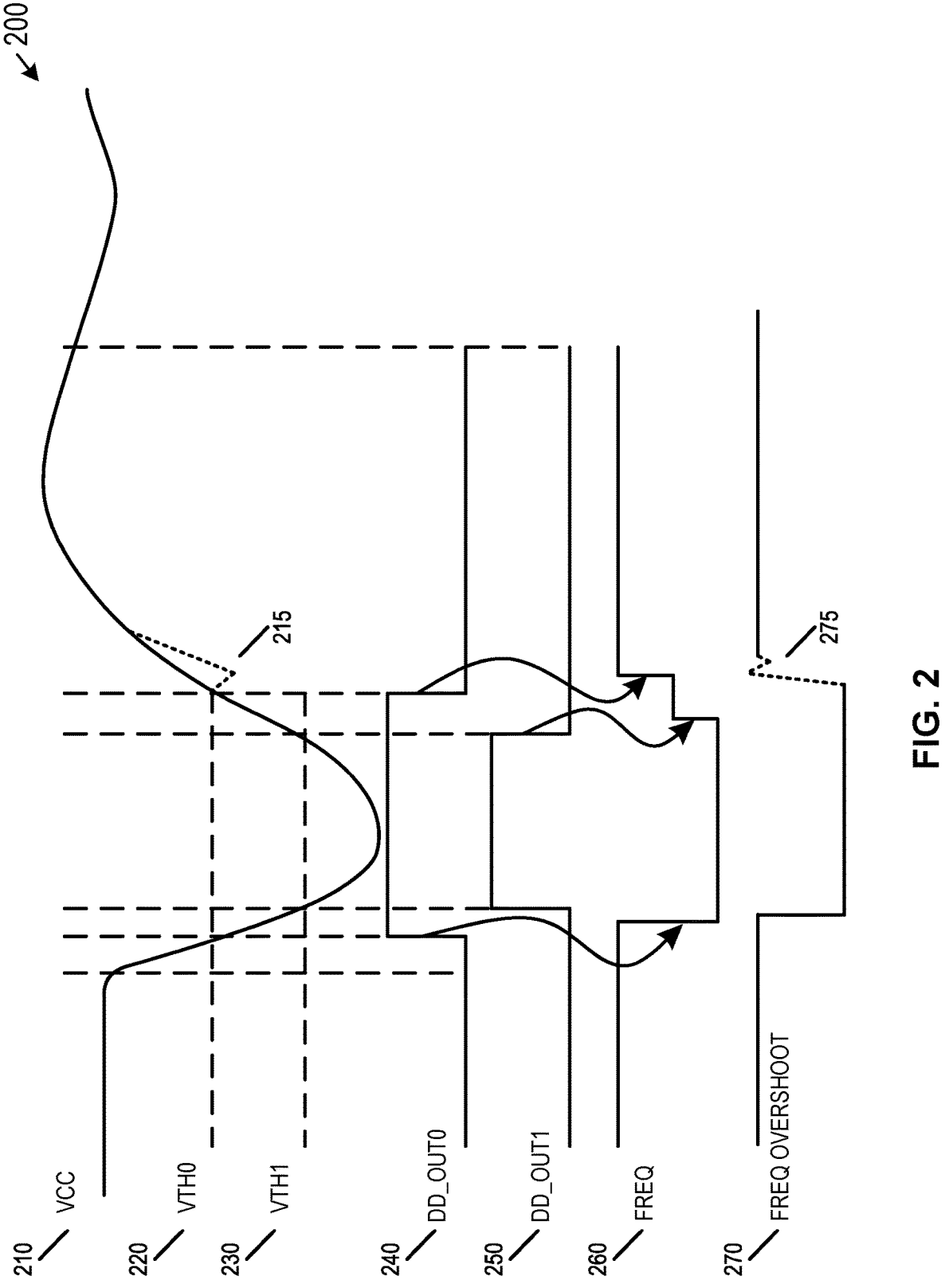
FIG. 2 shows timing diagrams illustrating first AFS waveforms, according to an embodiment.

FIG. 2 shows timing diagrams illustrating first AFS waveforms 200, according to an embodiment. AFS waveforms 200 show an example varying voltage level and pulse timing that may be generated by an AFS circuit, such as AFS circuit 100. In the example shown in FIG. 2, input VCC 210 droops below the first threshold voltage 220, droops further below the second threshold voltage 230, and then recovers, such as may occur when driving a power load.

As VCC 210 droops below the first threshold voltage 220, a first DD comparator may assert (e.g., cause to transition from low to high) a first DD comparator output 240, and an AFS circuit may respond by reducing an oscillator output frequency 260 to initiate a quick frequency slowdown. When the VCC 210 droop crosses the second threshold voltage 230, a second DD comparator output 250 may be asserted by a second DD comparator. When the supply is recovering from the droop, the second DD comparator output 250 is deasserted, followed by deasserting the first DD comparator output 240. The oscillator output frequency 260 is restored by half when the second DD comparator output 250 deasserts, and the oscillator output frequency 260 is restored fully when the first DD comparator output 240 is deasserted.

While FIG. 2 shows VCC 210 drooping below both first threshold voltage 220 and second threshold voltage 220, the voltage recovery may not recover correctly (e.g., gradual frequency exit) if VCC 210 does not droop low enough to cross second threshold voltage 220. When VCC 210 does not droop low enough to cross second threshold voltage 220, the second DD comparator output 250 may not trip (e.g., assert and deassert), and fully restoring the oscillator output frequency 260 in a single step may result in frequency overshoot or a secondary droop. In an example, if the voltage droop is complete, restoring the frequency in a single step may result in a secondary droop 215, a frequency overshoot 275, or both.

Figure 3:
FIG. 3 is a circuit diagram illustrating a second AFS circuit, according to an embodiment.

FIG. 3 is a circuit diagram illustrating a second AFS circuit 300, according to an embodiment. In contrast with the first AFS circuit 100 shown in FIG. 1, the second AFS circuit 300 provides a gradual frequency restoration with multiple small frequency steps. To implement this, the second AFS circuit 300 uses a single comparator block 310 and an asynchronous capacitance generator block 320 to detect a voltage droop and execute an asynchronous frequency slowdown by increasing a variable capacitance (Cb) 330 for each stage of the oscillator. Once the voltage droop is complete, the variable capacitance Cb 330 is decreased gradually to restore the frequency.

In operation, the comparator 310 receives an input voltage 305 and generates a comparator output 315. The asynchronous capacitance selector block 320 receives the comparator output 315 and an input frequency delta 325, and generates a variable capacitance 330. When a droop is detected and the comparator output 315 is asserted, the variable capacitance 330 is increased to decrease the frequency of an oscillator 340, such as for a frequency-lock loop (FLL) digitally controlled oscillator (DCO) or for a phase-locked loop (PLL) voltage-controlled oscillator (VCO). Once the input voltage 305 recovers from the droop, the capacitance is decreased to recover the oscillator frequency.

Figure 4:
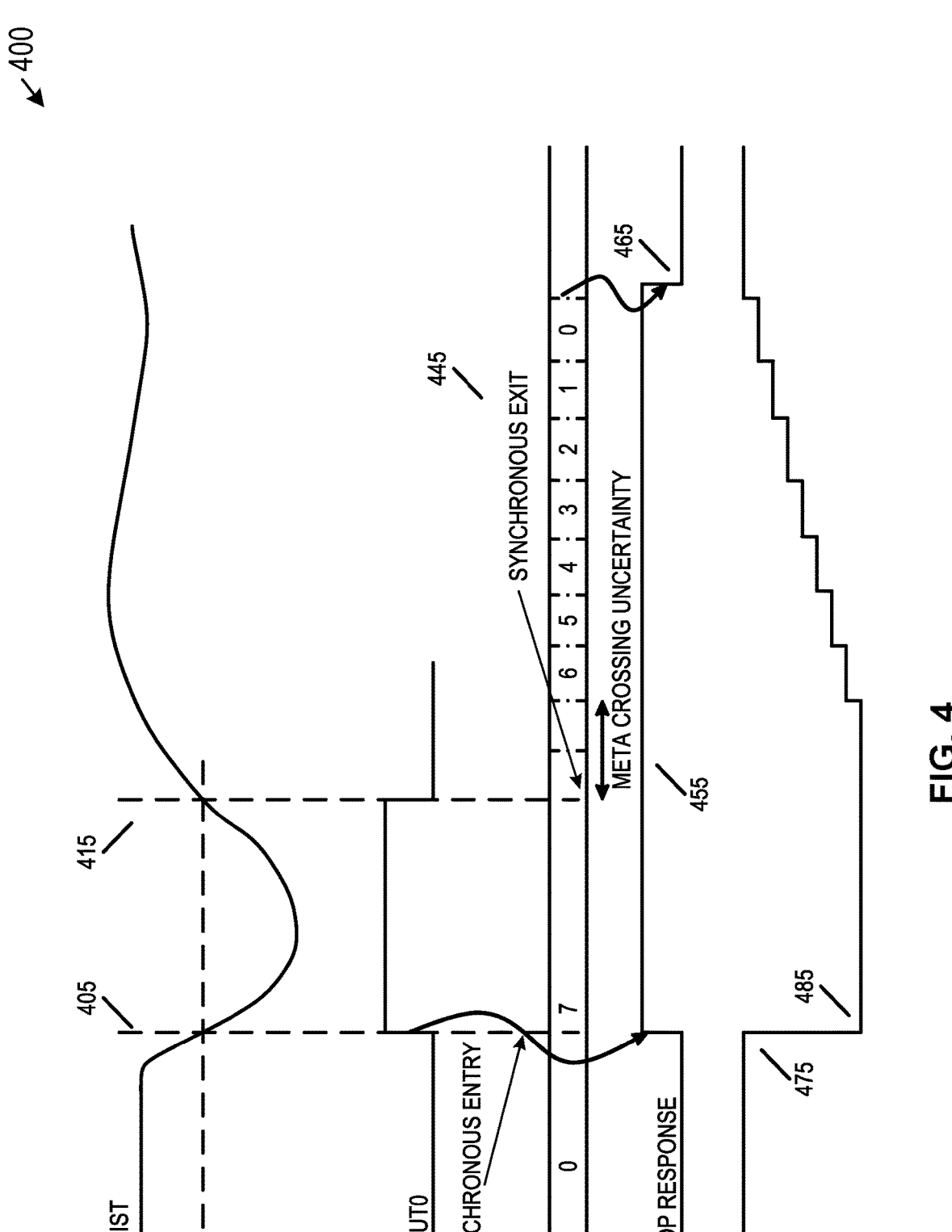
FIG. 4 is a timing diagram illustrating second AFS waveforms, according to an embodiment.

FIG. 4 is a timing diagram illustrating a second AFS waveforms 400, according to an embodiment. Waveforms 400 show input VccDist 410 drooping below a comparator threshold 420 at a first time 405, which asserts comparator output 430. When the comparator output 430 is asserted, the variable capacitance Cb 450 may be increased, which may assert a droop response output 460 and cause an operating frequency 470 to be reduced from a nominal frequency 475 to a reduced frequency 485. When input VccDist 410 recovers back above comparator threshold 420 at a second time 415, comparator output 430 is deasserted, the variable capacitance Cb 450 is decreased gradually to recover the frequency in steps from the reduced frequency 485 to the nominal frequency 475. While FIG. 4 shows a constant comparator threshold 420 for both voltage droop detection and voltage recovery detection, a different threshold may be used for each. In an example, a voltage droop detection threshold (e.g., at first time 405) may be lower than a voltage recovery detection threshold (e.g., at second time 415) to provide a hysteresis and reduce or eliminate an oscillation between states.

The droop response output 460 is asserted at an asynchronous entry 440 at first time 405 and subsequently deasserted at FLL deassertion time 465. In the example shown in FIG. 4, the FLL deassertion time 465 may follow a synchronous exit 445, a meta crossing uncertainty 455, and a gradual decrease of the variable capacitance Cb 450.

Figure 5:
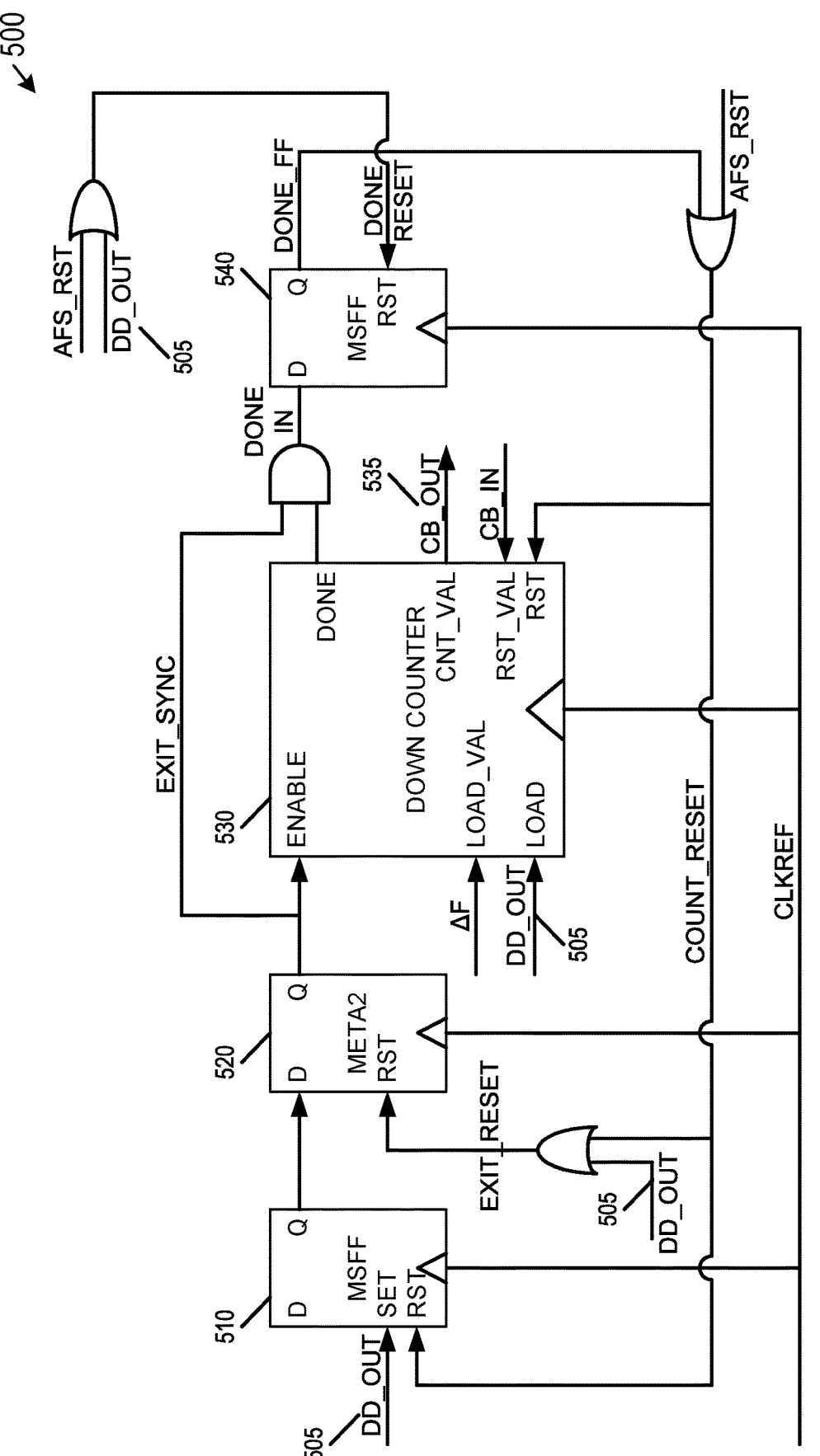
FIG. 5 is a circuit diagram illustrating a first variable capacitance selection circuit, according to an embodiment.

FIG. 5 is a circuit diagram illustrating a first variable capacitance selector circuit 500, according to an embodiment. Circuit 500 may be used to generate a variable output capacitance, such as the asynchronous capacitance selector block 320 shown in FIG. 3. Circuit 500 may include a first flip flop 510, meta-stable hardened flip flop (e.g., synchronizer) 520, a down counter 530, and a second flip flop 540. The first flip flop 510 may receive a droop detection output 505, such as from a comparator circuit 310 shown in FIG. 3. The output of the first flip flop 510 may be provided to the synchronizer 520, whose output may be provided to a down counter 530. The down counter 530 may be used to select variable capacitance 535 based on the droop detection output 505, such as to generate multiple levels of variable capacitance 450 shown in FIG. 4.

Figure 6:
FIG. 6 is a circuit diagram illustrating a frequency recovery circuit, according to an embodiment.
Figure 6:

FIG. 6 is a circuit diagram illustrating a second variable capacitance selector circuit 600, according to an embodiment. Circuit 600 may be used to select a variable output capacitance, such as the asynchronous capacitance selector block 320 shown in FIG. 3. Circuit 600 may be used to monitor low-to-high (L2H) and high-to-low (H2L) transitions of a droop detector output. In response to these transitions, circuit 600 changes a variable capacitance value from a steady-state capacitance to a user-defined frequency slowdown capacitance, then returns the capacitance back to steady-state. The circuit 600 in FIG. 6 shows the details of the circuit components and input/output (I/O) signals, and FIG. 7 shows waveforms corresponding to each of these I/O signals for circuit 600.

In operation, circuit 600 includes a pulse generator 610 that receives a droop detector output and generates a L2H detection pulse, which may be used as an asynchronous reset signal for state elements in circuit 600. The L2H detection pulse, a PLL lock signal and a counter signal are provided to a first NOR gate 620 to generate a H2L reset signal. The H2L reset signal is provided to a first DD comparator 630 to generate a DD output H2L detection signal. The DD output H2L detection signal is provided to a clock synchronization block 640 to generate a DD output H2L detection synchronization signal. The DD output H2L detection synchronization signal is provided to a pulse generator 650 to generate a H2L detection pulse. The pulse generator 650 may include a pulse generator circuit 660, which may include a NOT gate and an AND gate to generate the H2L detection pulse.

In a parallel path, a second NOR gate 625 may receive the PLL lock signal and a H2L detection pulse and generate a L2H reset signal. The H2L detection pulse may be used as an asynchronous reset signal for state elements in circuit 600. The L2H reset signal may be provided to a second DD comparator 635 to generate a DD output L2H detection signal. The DD output L2H detection signal is provided to an OR gate 645 to generate an AFS open-loop enable signal. The DD output L2H detection signal is also provided to a multiplexer 655 to select between a VCO capacitance value and an AFS capacitance value. The multiplexer 655 may select the AFS capacitance value while the L2H detection remains asserted. The output of multiplexer 655 is provided to an asynchronous low-dropout (LD) down counter 665. The down counter 665 also receives the DD output H2L detection synchronization signal generated by the clock synchronization block 640 to form a count enable signal for the variable capacitance code. The variable capacitance signal may be provided to a VCO 675, such as to provide a gradual frequency recovery. When the count enable signal is asserted, the L2H detection signal is deasserted to allow circuit 600 to monitor for and respond to a subsequent droop event. FIG. 7 shows waveforms corresponding to the signals indicated in FIG. 6.

Figure 7:
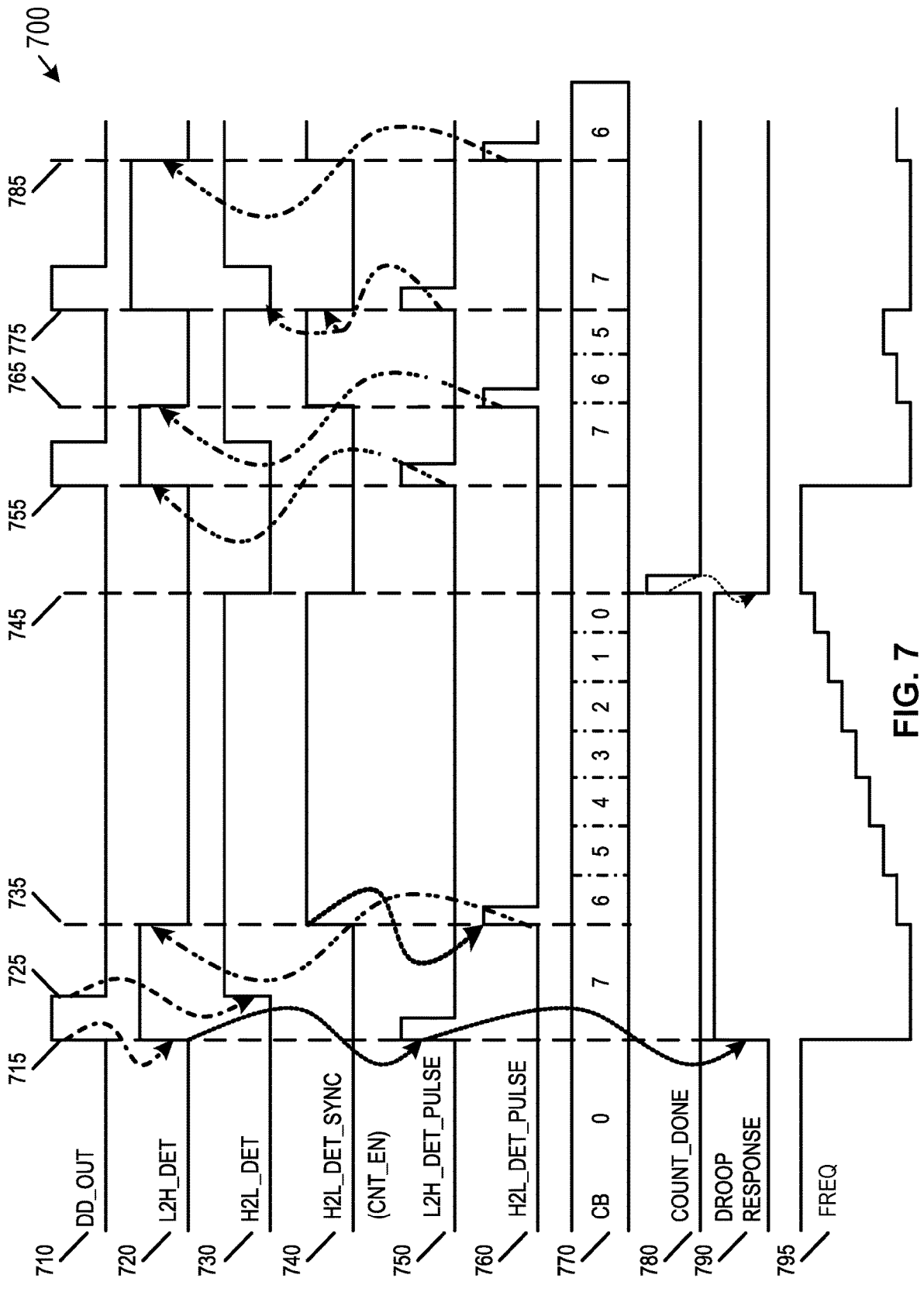
FIG. 7 shows a timing diagram illustrating frequency recovery circuit waveforms, according to an embodiment.

FIG. 7 shows a timing diagram illustrating frequency recovery circuit waveforms 700, according to an embodiment. When the DD output signal 710 is asserted at first time 715, the L2H detection signal 720 is asserted. The L2H detection signal 720 causes the L2H detection pulse 750 to be asserted, which may cause the variable capacitance 770 to be adjusted from steady state capacitance (e.g., CB=0) to a frequency slowdown capacitance (e.g., CB=7), which causes the droop response output 790 to be asserted and a frequency 795 to change from a nominal frequency to a reduced frequency.

When the DD output signal 710 is subsequently deasserted at second time 725, the H2L detection signal 730 is asserted. When the H2L detection synchronization signal 740 is asserted at third time 735, the H2L detection pulse 760 is asserted, and the L2H detection signal 720 is deasserted. The variable capacitance 770 then returns from the frequency slowdown capacitance value back to the steady state capacitance value, and the frequency 795 recovers from the reduced frequency to the nominal frequency. When the variable capacitance 770 reaches the steady state capacitance value at fourth time 745, a count done signal 780 is asserted, which causes the droop response output 790 to be deasserted.

A L2H detection pulse 750 and a H2L detection pulse 760 may be used to reset signals for state elements in the circuit implementation. In an example, the L2H detection pulse 750 may be asserted at fifth time 755, which causes the L2H detection signal 720 to be asserted. This may cause the variable capacitance 770 to be adjusted from steady state capacitance to the frequency slowdown capacitance, and cause the frequency 795 to change from the nominal frequency to the reduced frequency.

The H2L detection pulse 760 may be asserted at sixth time 765, which causes the L2H detection signal 720 to be deasserted. This may cause the variable capacitance 770 to be adjusted from the frequency slowdown capacitance back toward the steady state capacitance in multiple steps, and cause the frequency 795 to recover from the reduced frequency toward the nominal frequency. Before the frequency recovery is complete, an additional L2H detection pulse 750 may be asserted at seventh time 775, which causes the H2L detection signal 730 and the H2L detection synchronization signal to be deasserted, again resetting variable capacitance 770 and frequency 795. Finally, the H2L detection pulse 760 may then be asserted at eight time 785, which causes the L2H detection signal 720 to be deasserted, which may begin the adjustment of the variable capacitance 770 toward the steady state capacitance and begin the recovery of frequency 795 toward the nominal frequency. An example of clock frequency signals associated with these multiple resets before full frequency recovery is shown in FIG. 8.

Figure 8:
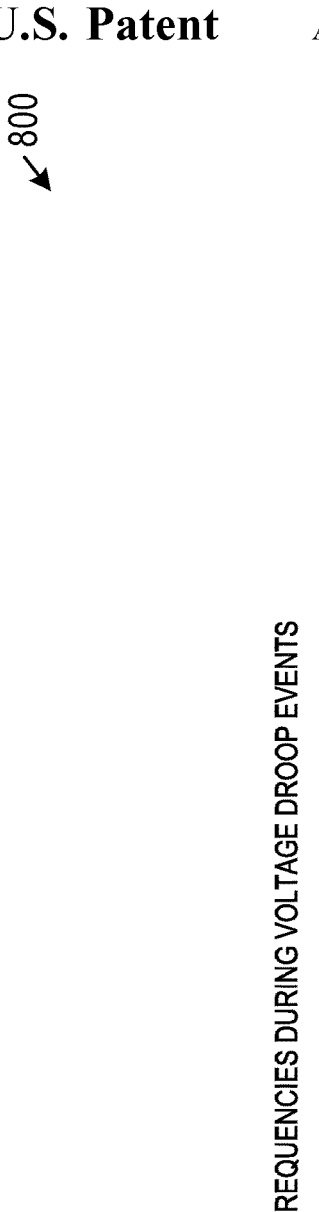
FIG. 8 is a graph illustrating clock frequency signals in response to supply voltage droop detection, according to an embodiment.
Figure 8:
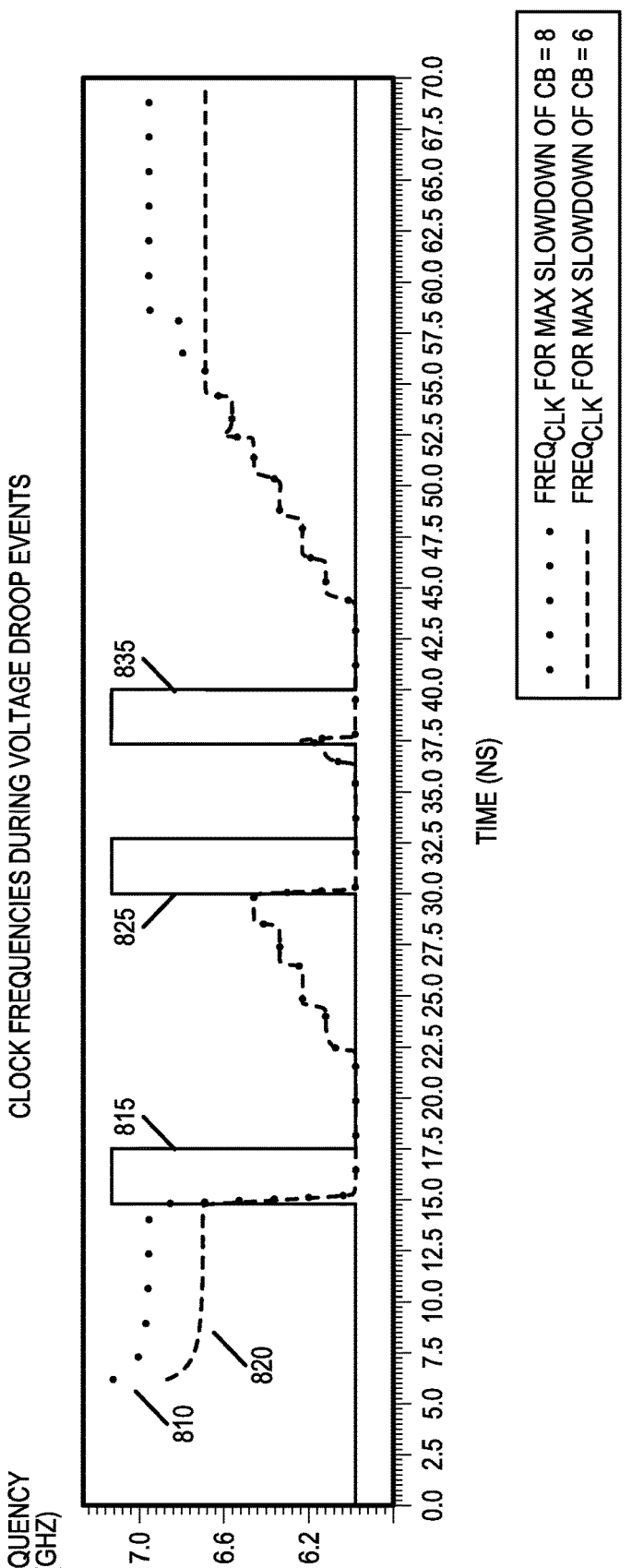

FIG. 8 is a graph illustrating clock frequency signals 800, according to an embodiment. FIG. 8 shows clock frequency signals 800 as a function of time in the presence of a first droop event 815, a second droop event 825, and a third droop event 835. Clock frequency signals 800 include a first clock frequency signal 810 with an eight-step maximum variable capacitance slowdown and a second clock frequency signal 820 with a six-step maximum variable capacitance slowdown. In response to the first droop event 815, both first signal 810 and second signal 820 reduce to a minimum frequency value, then recover in the expected stepwise fashion. Similarly, both first signal 810 and second signal 820 reduce to a minimum frequency value in response to the second droop event 825 and to the third droop event 835. Following the third droop event 835, each of the first signal 810 and second signal 820 recover in a stepwise fashion to frequency levels before the first droop event 815. This shows the ability of the frequency recovery circuit to respond asynchronously to droop events that occur before or during the gradual frequency exit.

Figure 9:
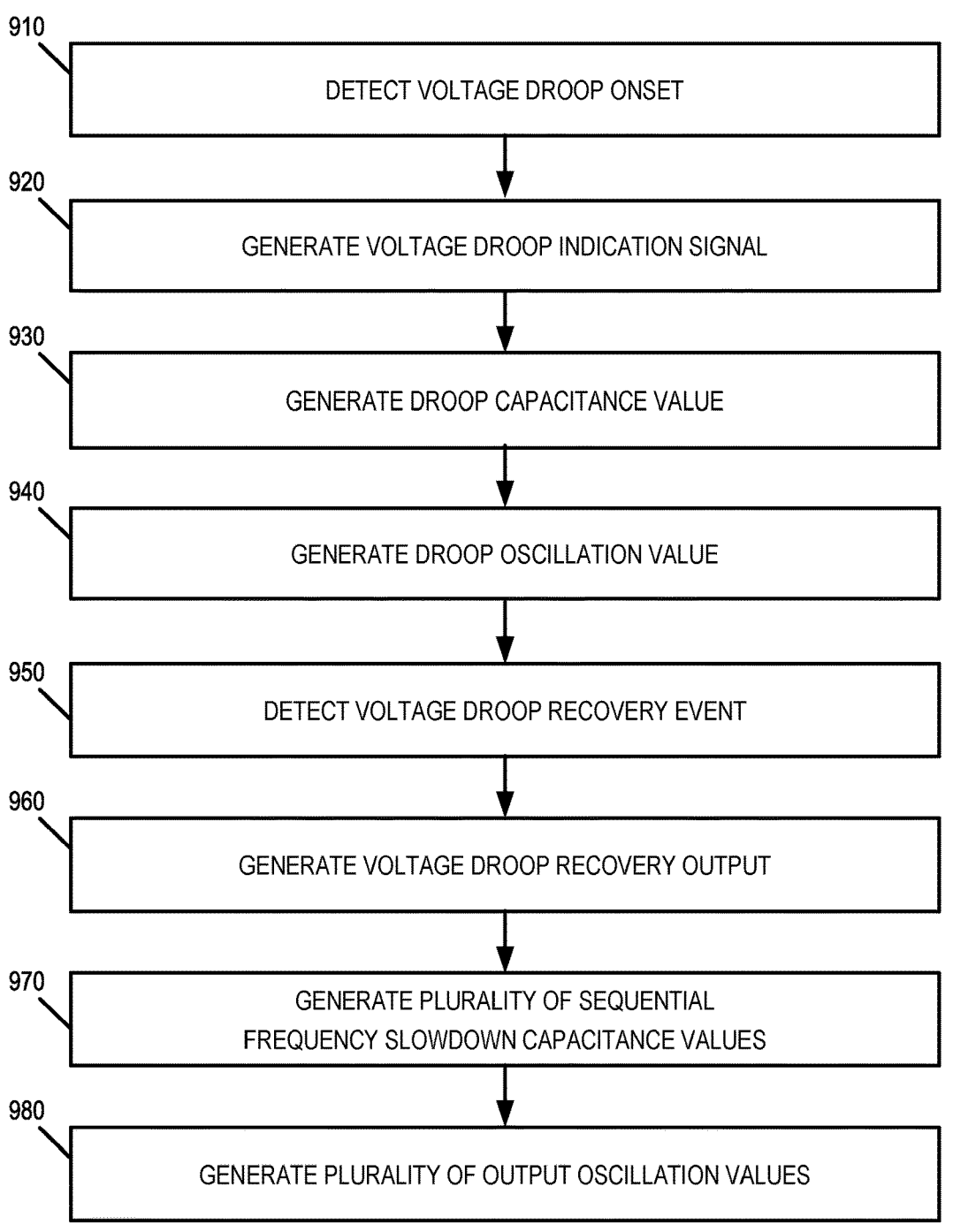
FIG. 9 is a flowchart illustrating a method, according to an embodiment.

FIG. 9 is a flowchart illustrating a method 900, according to an embodiment. Method 900 includes detecting 910 the onset of a voltage droop event and generating 920 a voltage droop detection output at a voltage droop detector comparator circuit. At 930, a droop capacitance value is generated at an asynchronous capacitance circuit based on the voltage droop event. At 940, a droop oscillation value is generated at an electronic oscillator. The droop oscillation value may correspond to a lower voltage droop frequency. The voltage droop onset may be detected based on the voltage droop detector comparator circuit determining that a received input voltage falls below a voltage recovery threshold.

Method 900 may further include detecting 950 a voltage droop onset at the voltage droop detector comparator circuit. At 960, a voltage droop indication signal may be generated at the voltage droop detector comparator circuit in response to detecting the voltage droop onset. The voltage droop onset may occur subsequent to the voltage droop event. At 970, a plurality of sequential frequency slowdown capacitance values may be generated at the asynchronous capacitance circuit based on the voltage droop indication signal. At 980, a plurality of output oscillation values may be generated at the electronic oscillator. Each of the plurality of output oscillation values may be based on a corresponding value within the plurality of sequential frequency slowdown capacitance values. The plurality of output oscillation values may be used to provide a gradual frequency recovery from a lower voltage droop frequency to a steady-state frequency.

The detection of the voltage droop onset may be based on the voltage droop detector comparator circuit determining that a received input voltage rises above a voltage droop threshold. The frequency change from the steady-state frequency to the lower voltage droop frequency may include an asynchronous frequency change. The frequency change from the lower voltage droop frequency to the steady-state frequency may include a synchronous, gradual frequency change.

A droop detector output signal may be generated at the voltage droop detector comparator circuit. The voltage droop detection output may include a low-to-high (L2H) transition within the droop detector output signal. Similarly, the voltage droop indication signal may include a high-to-low (H2L) transition within the droop detector output signal. A L2H detection signal may be generated in response to the L2H transition at a L2H detector circuit within the asynchronous capacitance circuit. A H2L detection signal may be generated in response to the H2L transition at a H2L detector circuit within the asynchronous capacitance circuit.

The droop capacitance value may be generated based on the L2H detection signal an asynchronous capacitance generator circuit within the asynchronous capacitance circuit. The droop capacitance value may be generated asynchronously. The plurality of sequential frequency slowdown capacitance values may be generated based on the H2L detection signal at the asynchronous capacitance generator circuit. The plurality of sequential frequency slowdown capacitance values may be generated synchronously.

An H2L detection synchronization signal may be generated based on the H2L detection signal at a clock synchronization circuit within the asynchronous capacitance circuit. The plurality of sequential frequency slowdown capacitance values may be generated synchronously in response to a receipt of the H2L detection synchronization signal. The electronic oscillator may include one or more of a digitally controlled oscillator and a voltage-controlled oscillator.

Figure 10:
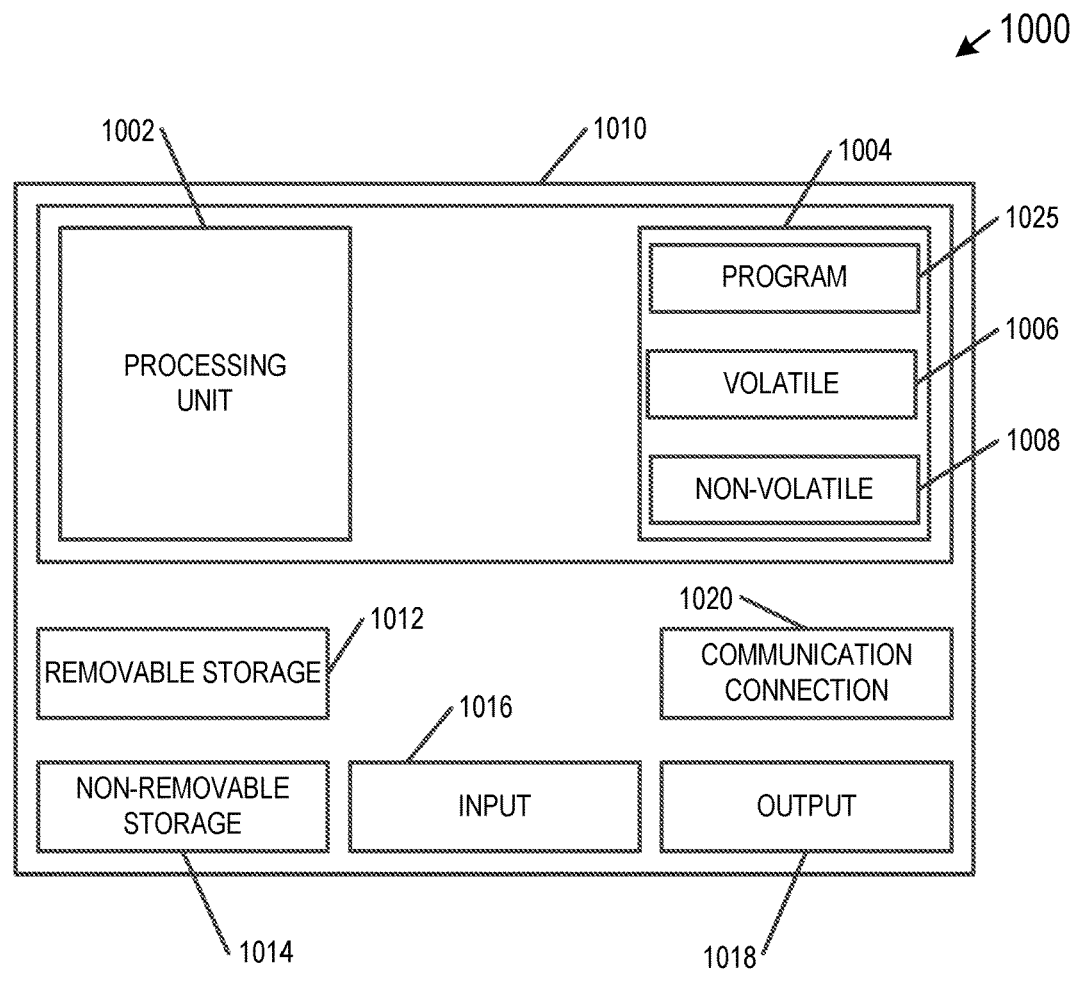
FIG. 10 is a block diagram of a computing device, according to an embodiment.

FIG. 10 is a block diagram of a computing device 1000, according to an embodiment. The performance of one or more components within computing device 1000 may be improved by including one or more of the circuits or circuitry methods described herein. In an example, computing device 1000 includes a voltage droop detector comparator circuit, an asynchronous capacitance circuit coupled to the voltage droop detector comparator circuit, and an electronic oscillator coupled to the asynchronous capacitance circuit, the electronic oscillator to provide a gradual frequency recovery from a lower voltage droop frequency to a steady-state frequency. In one embodiment, multiple such computer systems are used in a distributed network to implement multiple components in a transaction-based environment. An object-oriented, service-oriented, or other architecture may be used to implement such functions and communicate between the multiple systems and components. In some embodiments, the computing device of FIG.

10 is an example of a client device that may invoke methods described herein over a network. In some embodiments, the computing device of FIG. 10 is an example of one or more of the personal computer, smartphone, tablet, or various servers.

One example computing device in the form of a computer 1010, may include a processing unit 1002, memory 1004, removable storage 1012, and non-removable storage 1014. Although the example computing device is illustrated and described as computer 1010, the computing device may be in different forms in different embodiments. For example, the computing device may instead be a smartphone, a tablet, or other computing device including the same or similar elements as illustrated and described with regard to FIG. 10. Further, although the various data storage elements are illustrated as part of the computer 1010, the storage may include cloud-based storage accessible via a network, such as the Internet.

Returning to the computer 1010, memory 1004 may include volatile memory 1006 and non-volatile memory 1008. Computer 1010 may include or have access to a computing environment that includes a variety of computer-readable media, such as volatile memory 1006 and non-volatile memory 1008, removable storage 1012 and non-removable storage 1014. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 1010 may include or have access to a computing environment that includes input 1016, output 1018, and a communication connection 1020. The input 1016 may include one or more of a touchscreen, touchpad, mouse, keyboard, camera, and other input devices. The input 1016 may include a navigation sensor input, such as a GNSS receiver, a SOP receiver, an inertial sensor (e.g., accelerometers, gyroscopes), a local ranging sensor (e.g., LIDAR), an optical sensor (e.g., cameras), or other sensors. The computer may operate in a networked environment using a communication connection 1020 to connect to one or more remote computers, such as database servers, web servers, and another computing device. An example remote computer may include a personal computer (PC), server, router, network PC, a peer device or other common network node, or the like. The communication connection 1020 may be a network interface device such as one or both of an Ethernet card and a wireless card or circuit that may be connected to a network. The network may include one or more of a Local Area Network (LAN), a Wide Area Network (WAN), the Internet, and other networks.

Computer-readable instructions stored on a computer-readable medium are executable by the processing unit 1002 of the computer 1010. A hard drive (magnetic disk or solid state), CD-ROM, and RAM are some examples of articles including a non-transitory computer-readable medium. For example, various computer programs 1025 or apps, such as one or more applications and modules implementing one or more of the methods illustrated and described herein or an app or application that executes on a mobile device or is accessible via a web browser, may be stored on a non-transitory computer-readable medium.

The apparatuses and methods described above may include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" may mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A may include a single element or multiple elements. Item B may include a single element or multiple elements. Item C may include a single element or multiple elements.

In the detailed description and the claims, a list of items joined by the term "one of" may mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A may include a single element or multiple elements. Item B may include a single element or multiple elements. Item C may include a single element or multiple elements.

ADDITIONAL NOTES AND EXAMPLES

Example 1 is an apparatus comprising: a voltage droop detector comparator circuit to generate a voltage droop indication signal in response to detecting a voltage droop onset; an asynchronous capacitance circuit to generate a plurality of sequential frequency slowdown capacitance values based on the voltage droop indication signal; and an electronic oscillator to generate a plurality of output oscillation values, each of the plurality of output oscillation values based on a corresponding value within the plurality of sequential frequency slowdown capacitance values, the plurality of output oscillation values providing a gradual frequency recovery from a lower voltage droop frequency to a steady-state frequency.

In Example 2, the subject matter of Example 1 includes, wherein detecting the voltage droop onset is based on the voltage droop detector comparator circuit determining that a received input voltage rises above a voltage droop threshold.

In Example 3, the subject matter of Examples 1-2 includes, wherein: the voltage droop detector comparator circuit is further to detect a voltage droop event and generate a voltage droop detection output, the voltage droop event occurring prior to the voltage droop onset; the asynchronous capacitance circuit is further to generate a droop capacitance value based on the voltage droop event; and the electronic oscillator is further to generate a droop oscillation value corresponding to the lower voltage droop frequency.

In Example 4, the subject matter of Example 3 includes, wherein the voltage droop onset is detected based on the voltage droop detector comparator circuit determining that a received input voltage falls below a voltage recovery threshold.

In Example 5, the subject matter of Examples 3-4 includes, wherein the asynchronous capacitance circuit is further to: provide an asynchronous frequency change from the steady-state frequency to the lower voltage droop frequency; and provide a synchronous frequency change from the lower voltage droop frequency to the steady-state frequency.

In Example 6, the subject matter of Examples 3-5 includes, wherein: the voltage droop detector comparator circuit generates a droop detector output signal; the voltage droop detection output includes a low-to-high (L2H) transition within the droop detector output signal; and the voltage droop indication signal includes a high-to-low (H2L) transition within the droop detector output signal.

In Example 7, the subject matter of Example 6 includes, wherein the asynchronous capacitance circuit further includes: a L2H detector circuit to generate a L2H detection signal in response to the L2H transition; and a H2L detector circuit to generate a H2L detection signal in response to the H2L transition.

In Example 8, the subject matter of Example 7 includes, wherein the asynchronous capacitance circuit further includes an asynchronous capacitance generator circuit, the asynchronous capacitance generator circuit to generate the droop capacitance value based on the L2H detection signal, wherein the droop capacitance value is generated asynchronously.

In Example 9, the subject matter of Example 8 includes, wherein the asynchronous capacitance generator circuit is further to generate the plurality of sequential frequency slowdown capacitance values based on the H2L detection signal, wherein the plurality of sequential frequency slowdown capacitance values is generated synchronously.

In Example 10, the subject matter of Example 9 includes, wherein: the asynchronous capacitance circuit further includes a clock synchronization circuit to generate an H2L detection synchronization signal based on the H2L detection signal; and the plurality of sequential frequency slowdown capacitance values are generated synchronously in response to a receipt of the H2L detection synchronization signal.

In Example 11, the subject matter of Examples 1-10 includes, wherein the electronic oscillator includes at least one of a frequency-lock loop digitally controlled oscillator and a phase-locked loop voltage-controlled oscillator.

Example 12 is a method comprising: detecting a voltage droop onset at a voltage droop detector comparator circuit; generating a voltage droop indication signal at the voltage droop detector comparator circuit in response to detecting the voltage droop onset; generating a plurality of sequential frequency slowdown capacitance values at an asynchronous capacitance circuit based on the voltage droop indication signal; and generating a plurality of output oscillation values at an electronic oscillator, each of the plurality of output oscillation values based on a corresponding value within the plurality of sequential frequency slowdown capacitance values, the plurality of output oscillation values providing a gradual frequency recovery from a lower voltage droop frequency to a steady-state frequency.

In Example 13, the subject matter of Example 12 includes, wherein detecting the voltage droop onset is based on the voltage droop detector comparator circuit determining that a received input voltage rises above a voltage droop threshold.

In Example 14, the subject matter of Examples 12-13 includes, detecting a voltage droop event and generate a voltage droop detection output at the voltage droop detector comparator circuit, the voltage droop event occurring prior to the voltage droop onset; generating a droop capacitance value at the asynchronous capacitance circuit based on the voltage droop event; and generating a droop oscillation value at the electronic oscillator, the droop oscillation value corresponding to the lower voltage droop frequency.

In Example 15, the subject matter of Example 14 includes, wherein the voltage droop onset is detected based on the voltage droop detector comparator circuit determining that a received input voltage falls below a voltage recovery threshold.

In Example 16, the subject matter of Examples 14-15 includes, providing an asynchronous frequency change from the steady-state frequency to the lower voltage droop frequency; and providing a synchronous frequency change from the lower voltage droop frequency to the steady-state frequency.

In Example 17, the subject matter of Examples 14-16 includes, generating a droop detector output signal at the voltage droop detector comparator circuit; wherein: the voltage droop detection output includes a low-to-high (L2H) transition within the droop detector output signal; and the voltage droop indication signal includes a high-to-low (H2L) transition within the droop detector output signal.

In Example 18, the subject matter of Example 17 includes, generating a L2H detection signal in response to the L2H transition at a L2H detector circuit within the asynchronous capacitance circuit; and generating a H2L detection signal in response to the H2L transition at a H2L detector circuit within the asynchronous capacitance circuit.

In Example 19, the subject matter of Example 18 includes, generating the droop capacitance value based on the L2H detection signal an asynchronous capacitance generator circuit within the asynchronous capacitance circuit, wherein the droop capacitance value is generated asynchronously.

In Example 20, the subject matter of Example 19 includes, generating the plurality of sequential frequency slowdown capacitance values based on the H2L detection signal at the asynchronous capacitance generator circuit, wherein the plurality of sequential frequency slowdown capacitance values is generated synchronously.

In Example 21, the subject matter of Example 20 includes, generating an H2L detection synchronization signal based on the H2L detection signal at a clock synchronization circuit within the asynchronous capacitance circuit, wherein the plurality of sequential frequency slowdown capacitance values is generated synchronously in response to a receipt of the H2L detection synchronization signal.

In Example 22, the subject matter of Examples 12-21 includes, wherein the electronic oscillator includes at least one of a frequency-lock loop digitally controlled oscillator and a phase-locked loop voltage-controlled oscillator.

Example 23 is an apparatus comprising: a voltage droop detector comparator circuit; an asynchronous capacitance circuit coupled to the voltage droop detector comparator circuit; and an electronic oscillator coupled to the asynchronous capacitance circuit, the electronic oscillator to provide a gradual frequency recovery from a lower voltage droop frequency to a steady-state frequency.

In Example 24, the subject matter of Example 23 includes, wherein the asynchronous capacitance circuit further includes an asynchronous capacitance generator circuit coupled to the voltage droop detector comparator circuit.

In Example 25, the subject matter of Example 24 includes, wherein the asynchronous capacitance circuit further includes a L2H detector circuit coupled between the voltage droop detector comparator circuit and the asynchronous capacitance generator circuit.

In Example 26, the subject matter of Examples 24-25 includes, wherein the asynchronous capacitance circuit further includes a H2L detector circuit coupled between the voltage droop detector comparator circuit and the asynchronous capacitance generator circuit.

In Example 27, the subject matter of Examples 24-26 includes, wherein the asynchronous capacitance circuit is coupled between the voltage droop detector comparator circuit and the electronic oscillator.

In Example 28, the subject matter of Example 27 includes, wherein the electronic oscillator includes at least one of a frequency-lock loop digitally controlled oscillator and a phase-locked loop voltage-controlled oscillator.

Example 29 is at least one machine-readable medium including instructions that, when executed by processing circuitry, cause the processing circuitry to perform operations to implement of any of Examples 1-28.

Example 30 is an apparatus comprising means to implement of any of Examples 1-28.

Example 31 is a system to implement of any of Examples 1-28.

Example 32 is a method to implement of any of Examples 1-28.

The subject matter of any Examples above may be combined in any combination.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

The invention claimed is:

1. An apparatus comprising:
   a voltage droop detector comparator circuit to generate a voltage droop indication signal in response to detecting a voltage droop onset;
   an asynchronous capacitance circuit to generate a plurality of sequential frequency slowdown capacitance values based on the voltage droop indication signal; and an electronic oscillator to generate a plurality of output oscillation values, each of the plurality of output oscillation values based on a corresponding value within the plurality of sequential frequency slowdown capacitance values, the plurality of output oscillation values providing a gradual frequency recovery from a lower voltage droop frequency to a steady-state frequency.

2. The apparatus of claim 1, wherein detecting the voltage droop onset is based on the voltage droop detector comparator circuit determining that a received input voltage rises above a voltage droop threshold.

3. The apparatus of claim 1, wherein:
   the voltage droop detector comparator circuit is further to detect a voltage droop event and generate a voltage droop detection output, the voltage droop event occurring prior to the voltage droop onset;
   the asynchronous capacitance circuit is further to generate a droop capacitance value based on the voltage droop event; and
   the electronic oscillator is further to generate a droop oscillation value corresponding to the lower voltage droop frequency.

4. The apparatus of claim 3, wherein the voltage droop onset is detected based on the voltage droop detector comparator circuit determining that a received input voltage falls below a voltage recovery threshold.

5. The apparatus of claim 3, wherein the asynchronous capacitance circuit is further to:
   provide an asynchronous frequency change from the steady-state frequency to the lower voltage droop frequency; and
   provide a synchronous frequency change from the lower voltage droop frequency to the steady-state frequency.

6. The apparatus of claim 3, wherein:
   the voltage droop detector comparator circuit generates a droop detector output signal;
   the voltage droop detection output includes a low-to-high (L2H) transition within the droop detector output signal; and
   the voltage droop indication signal includes a high-to-low (H2L) transition within the droop detector output signal.

7. The apparatus of claim 6, wherein the asynchronous capacitance circuit further includes:
   a L2H detector circuit to generate a L2H detection signal in response to the L2H transition; and
   a H2L detector circuit to generate a H2L detection signal in response to the H2L transition.

8. The apparatus of claim 7, wherein the asynchronous capacitance circuit further includes an asynchronous capacitance generator circuit, the asynchronous capacitance generator circuit including a first flip-flop configured to receive the voltage droop detection output, a synchronizer coupled to the first flip-flop, a down-counter coupled to the synchronizer and configured to select a variable capacitance value, and a second flip-flop coupled to the down-counter, the asynchronous capacitance generator circuit to generate the droop capacitance value based on the L2H detection signal, wherein the droop capacitance value is generated asynchronously.

9. The apparatus of claim 8, wherein the asynchronous capacitance generator circuit is further to generate the plurality of sequential frequency slowdown capacitance values based on the H2L detection signal, wherein the plurality of sequential frequency slowdown capacitance values is generated synchronously.

10. The apparatus of claim 9, wherein:

the asynchronous capacitance circuit further includes a clock synchronization circuit to generate an H2L detection synchronization signal based on the H2L detection signal; and the plurality of sequential frequency slowdown capacitance values is generated synchronously in response to a receipt of the H2L detection synchronization signal.

11. A method comprising:

detecting a voltage droop onset at a voltage droop detector comparator circuit;

generating a voltage droop indication signal at the voltage droop detector comparator circuit in response to detecting the voltage droop onset;

generating a plurality of sequential frequency slowdown capacitance values at an asynchronous capacitance circuit based on the voltage droop indication signal; and generating a plurality of output oscillation values at an electronic oscillator, each of the plurality of output oscillation values based on a corresponding value within the plurality of sequential frequency slowdown capacitance values, the plurality of output oscillation values providing a gradual frequency recovery from a lower voltage droop frequency to a steady-state frequency.

12. The method of claim 11, further including:

detecting a voltage droop event and generate a voltage droop detection output at the voltage droop detector comparator circuit, the voltage droop event occurring prior to the voltage droop onset;

generating a droop capacitance value at the asynchronous capacitance circuit based on the voltage droop event; and generating a droop oscillation value at the electronic oscillator, the droop oscillation value corresponding to the lower voltage droop frequency.

13. The method of claim 12, further including:

providing an asynchronous frequency change from the steady-state frequency to the lower voltage droop frequency; and providing a synchronous frequency change from the lower voltage droop frequency to the steady-state frequency.

14. The method of claim 12, further including generating a droop detector output signal at the voltage droop detector comparator circuit; wherein:

the voltage droop detection output includes a low-to-high (L2H) transition within the droop detector output signal; and

14 the voltage droop indication signal includes a high-to-low (H2L) transition within the droop detector output signal.

15. The method of claim 14, further including:

generating a L2H detection signal in response to the L2H transition at a L2H detector circuit within the asynchronous capacitance circuit; and generating a H2L detection signal in response to the H2L transition at a H2L detector circuit within the asynchronous capacitance circuit.

16. The method of claim 15, further including generating the droop capacitance value based on the L2H detection signal at an asynchronous capacitance generator circuit within the asynchronous capacitance circuit, the asynchronous capacitance generator circuit including a first flip-flop configured to receive the voltage droop detection output, a synchronizer coupled to the first flip-flop, a down-counter coupled to the synchronizer and configured to select a variable capacitance value, and a second flip-flop coupled to the down-counter, wherein the droop capacitance value is generated asynchronously.

17. The method of claim 16, further including generating the plurality of sequential frequency slowdown capacitance values based on the H2L detection signal at the asynchronous capacitance generator circuit, wherein the plurality of sequential frequency slowdown capacitance values is generated synchronously.

18. An apparatus comprising:

a voltage droop detector comparator circuit;

an asynchronous capacitance circuit coupled to the voltage droop detector comparator circuit; and an electronic oscillator coupled to the asynchronous capacitance circuit, the electronic oscillator to provide a gradual frequency recovery from a lower voltage droop frequency to a steady-state frequency.

19. The apparatus of claim 18, wherein the asynchronous capacitance circuit further includes an asynchronous capacitance generator circuit coupled to the voltage droop detector comparator circuit, the asynchronous capacitance generator circuit including a first flip-flop, a synchronizer coupled to the first flip-flop, a down-counter coupled to the synchronizer and configured to select a variable capacitance value, and a second flip-flop coupled to the down-counter.

20. The apparatus of claim 19, wherein the asynchronous capacitance circuit is coupled between the voltage droop detector comparator circuit and the electronic oscillator.

* * * * *